United States Patent
Ramirez et al.

(10) Patent No.: US 9,634,639 B2
(45) Date of Patent: Apr. 25, 2017

(54) TUNABLE ELECTRONIC CIRCUIT WHICH CONVERTS BALANCED SIGNALS TO UNBALANCED SIGNALS

(71) Applicant: HARRIS CORPORATION, Melbourne, FL (US)

(72) Inventors: Daniel A. Ramirez, West Melbourne, FL (US); Ronald J. Hash, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 74 days.

(21) Appl. No.: 14/849,749

(22) Filed: Sep. 10, 2015

(65) Prior Publication Data

US 2017/0077894 A1    Mar. 16, 2017

(51) Int. Cl.
| | | |
|---|---|---|
| H01P 5/10 | (2006.01) | |
| H03H 7/42 | (2006.01) | |
| H03H 7/01 | (2006.01) | |
| H03H 9/24 | (2006.01) | |
| H01Q 1/50 | (2006.01) | |

(52) U.S. Cl.
CPC ............... *H03H 7/42* (2013.01); *H01Q 1/50* (2013.01); *H03H 7/0161* (2013.01); *H03H 9/2431* (2013.01)

(58) Field of Classification Search
CPC .... H01P 5/10; H01P 1/20; H01P 1/203; H01P 1/213; H01P 7/08; H01P 7/082
See application file for complete search history.

(56) References Cited

U.S. PATENT DOCUMENTS

| | | | | |
|---|---|---|---|---|
| 6,930,570 B2 * | 8/2005 | Nakamura | ........... | H03H 9/0038 333/193 |
| 7,126,444 B2 * | 10/2006 | Fukunaga | ............. | H01P 5/10 333/204 |
| 7,242,268 B2 * | 7/2007 | Hagiwara | ............ | H01P 1/15 333/103 |
| 7,688,158 B2 | 3/2010 | Rohani et al. | | |
| 8,482,365 B2 * | 7/2013 | Taniguchi | ........... | H01P 1/20345 333/175 |
| 8,766,739 B2 * | 7/2014 | Chen | ................... | H01P 1/20381 333/205 |

(Continued)

OTHER PUBLICATIONS

Jain, C.L., et al., "A High Power Tunable Balun," IETE Journal of Research, 18:7, 325-326, DOI: 10.1080/03772063.1972.11486998, Jul. 1972.

(Continued)

*Primary Examiner* — Hoang Nguyen
(74) *Attorney, Agent, or Firm* — Fox Rothschild LLP; Robert J. Sacco; Carol E. Thorstad-Forsyth

(57) ABSTRACT

Balun with tunable bandpass filter characteristic includes first, second and third coupling elements disposed on a substrate. The first and second coupling elements are arranged on the substrate relative to the third coupling element to couple two identical but out of phase signals to form a corresponding unbalanced signal in the third coupling element. A plurality of tunable resonator elements are distributed within an area of the substrate defined on one side by the first and second coupling elements and on an opposing side by the third coupling element. The tunable resonator elements are configured to selectively produce a bandpass filter response.

20 Claims, 4 Drawing Sheets

(56) References Cited

U.S. PATENT DOCUMENTS 9,270,008 B2 * 2/2016 Wada ................ H01P 1/20381
2012/0161896 A1 6/2012 Lee et al.

OTHER PUBLICATIONS

Boglione, L, et al., "A Tunable Marchand Balun At K Band in Silicon Germanium (SiGe) Technology," GeMiC 2015, Mar. 16-18, 2015, Nurnberg, Germany, p. 292-295, IMATech e.v. Ratingen, Germany, ISBN 978-3-9812668-6-3.

Hung, C., et al., "Asymmetrical Balun Design with Tunable Bandwidth and Transmission Zero," Proceedings of the Asia-Pacific Microwave Conference 2011, 978-0-85825-974-4, copyright 2011 Engineers Australia.

Zhou, L., et al., "Tunable Filtering Balun with Enhanced Stopband Rejection," Electronics Letters, Jul. 5, 2012, vol. 18, No. 14.

* cited by examiner

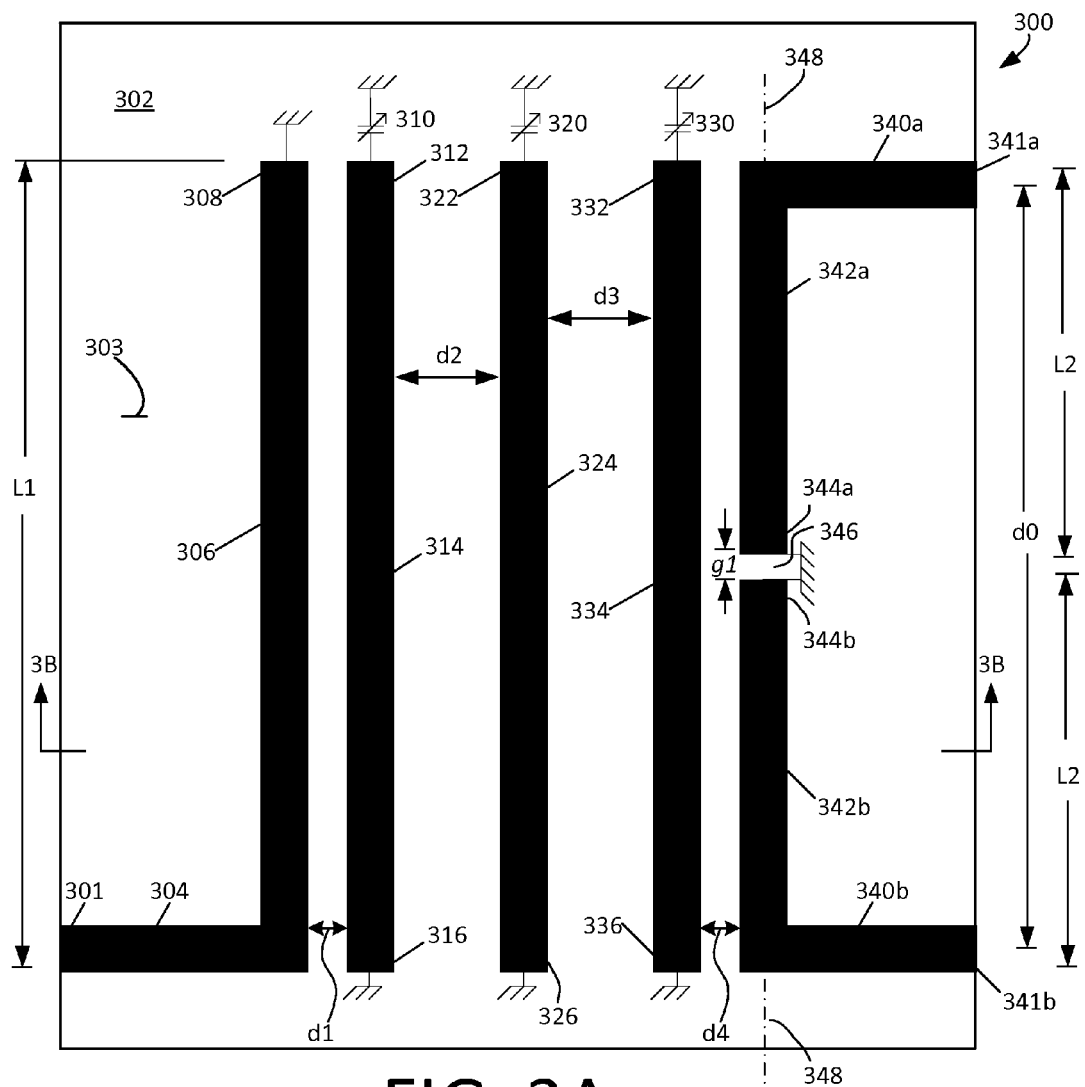
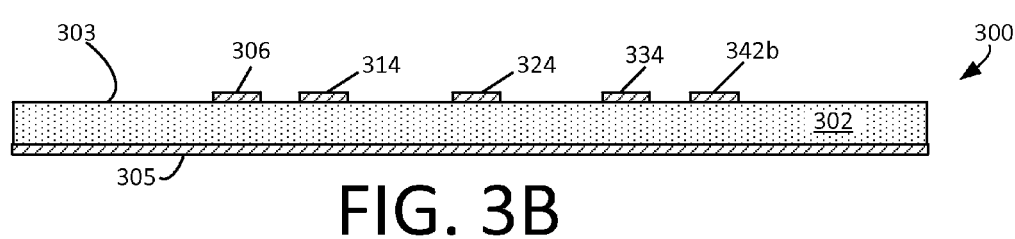

TUNABLE ELECTRONIC CIRCUIT WHICH CONVERTS BALANCED SIGNALS TO UNBALANCED SIGNALS

BACKGROUND OF THE INVENTION

Statement of the Technical Field

The inventive arrangements relate to radio frequency systems and more particularly to devices used to convert between balanced signals and unbalanced signals.

Description of the Related Art

In a radio frequency device signals can be communicated as balanced or unbalanced signals. In a balanced signal scenario two conductive signal lines are provided independent of a ground. Conversely, in an unbalanced signal scenario a single signal line is provided and the signal is evaluated relative to a ground. In a radio frequency system, it is sometimes necessary to transition from a portion of the circuit which operates using balanced signals to a portion of the circuit which operates using unbalanced signals. A common example of this occurs when transitioning between a balanced antenna system (e.g., a dipole) and an unbalanced transmission line (e.g. a microstrip transmission line) used as an antenna feed. In an unbalanced transmission line such as a microstrip, there is substantial asymmetry between the conductive strip that forms the transmission line conductor as compared to the reference conductor (which in the case of microstrip would be a ground plane conductor). In such an arrangement, the current densities in each conductor are very different and they are not in differential form. Unbalanced signal transmission structures must be transformed into balanced ones in order to feed balanced radiating elements, and vice versa. A balun is a device or circuit that is used to facilitate the transition of signals between balanced signal lines and unbalanced signal lines. An additional function which is commonly performed by the balun is to provide an impedance transformation suitable to provide impedance matching as between the balanced and unbalanced structures.

When a balun is used at the output of the antenna, filtering components are commonly disposed between the balun and the remainder of the communication system so that extraneous out-of-band signals are reduced in amplitude. In this regard, it has been suggested that the functions of a balun can be combined with a tunable bandpass filter (BPF). For example, at least one system has been proposed that utilizes a split ring resonator type of element to combine the function of a balun and a BPF in one circuit.

SUMMARY OF THE INVENTION

A tunable electronic circuit transitions signals between physical structures which form balanced signal transmission paths and those which form unbalanced signal transmission paths. The circuit is disposed on a substrate formed of a dielectric material. A balanced signal transmission structure includes first and second coupling elements which are disposed on the substrate, each symmetrically connected at one end to a signal ground defined by a ground plane. An unbalanced signal transmission structure including a third coupling element is disposed on the substrate and has one terminal end connected to the signal ground. The first and second coupling elements arranged on the substrate relative to the third coupling element to couple two identical but out of phase signals from the balanced signal transmission structure to the unbalanced signal transmission structure to form a corresponding unbalanced signal in the third coupling element. A plurality of tunable resonator elements are distributed within an area of the substrate defined on one side by the first and second coupling elements and on an opposing side by the third coupling element. The resonator elements are spaced apart from each other and from each of the first, second and third coupling elements. The resonator elements are cooperatively configured to produce a bandpass filter response in the tunable integrated microwave circuit when signals are communicated between the balanced signal structure and the unbalanced signal structure.

BRIEF DESCRIPTION OF THE DRAWINGS

Embodiments will be described with reference to the following drawing figures, in which like numerals represent like items throughout the figures, and in which:

FIG. 3A is a schematic representation showing a top view of a tunable circuit which combines the functions of a balun and a filter.

FIG. 3B is a schematic representation showing a cross-sectional view of the tunable circuit in FIG. 3A, taken along line 3B-3B.

DETAILED DESCRIPTION

Figure 1:
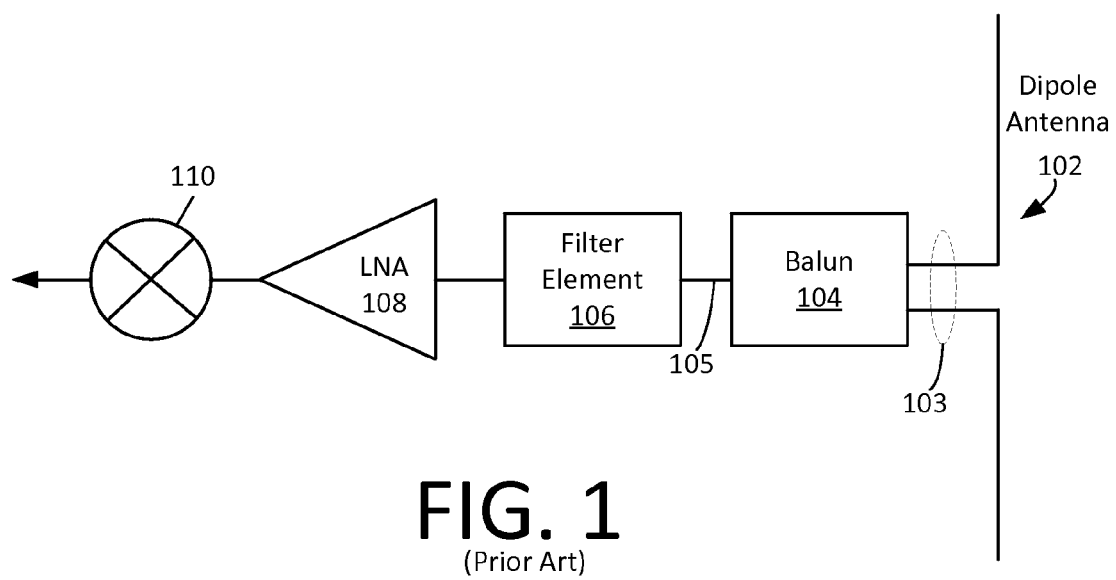
FIG. 1 is a block diagram of a conventional radio receiver system.

The invention is described with reference to the attached figures. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. However, the invention can be practiced without one or more of the specific details or with other methods. In other instances, well-known structures or operation are not shown in detail to avoid obscuring the invention. The invention is not limited by the illustrated ordering of acts or events, as some acts may occur in different orders and/or concurrently with other acts or events. Furthermore, not all illustrated acts or events are required to implement a methodology in accordance with the invention.

Reference throughout this specification to features, advantages, or similar language does not imply that all of the features and advantages that may be realized with the present invention should be or are in any single embodiment of the invention. Rather, language referring to the features and advantages is understood to mean that a specific feature, advantage, or characteristic described in connection with an embodiment is included in at least one embodiment of the present invention. Thus, discussions of the features and advantages, and similar language, throughout the specification may, but do not necessarily, refer to the same embodiment.

A balun is used to combine balanced signals to an unbalanced signal line. For example, in a conventional radio receiver 100 shown in FIG. 1, an antenna 102 having a balanced output 103 can be coupled to a balun 104. The balun 104 converts the balanced signal output of the antenna to an unbalanced signal 105. The output of the balun is commonly communicated to a filter element 106. The filter element 106 can be a Low Pass Filter, a Band Pass Filter (BPF), a diplexer, or a combination of one or more such elements. The filter element 106 typically provides its output to a Low Noise Amplifier (LNA) 108. An output of the LNA may be coupled to a mixer 110 or other suitable receiver elements.

A balun designed for wideband receive operation is known to suffer from certain drawbacks insofar as they tend to be rather large and difficult to make. Also, some baluns tend not to work well when there is grounded metal nearby. Signal loss suffered in the balun 104, transmission lines used to transport the balanced signals 103, the filter element 106 or interconnections between such elements are of special concern in a radio receiver if they occur before the signals arrive at the LNA. Such losses result in a degradation of the receiver's noise figure (NF), which can limit the sensitivity of a radio receiver to weak signals.

Figure 2:
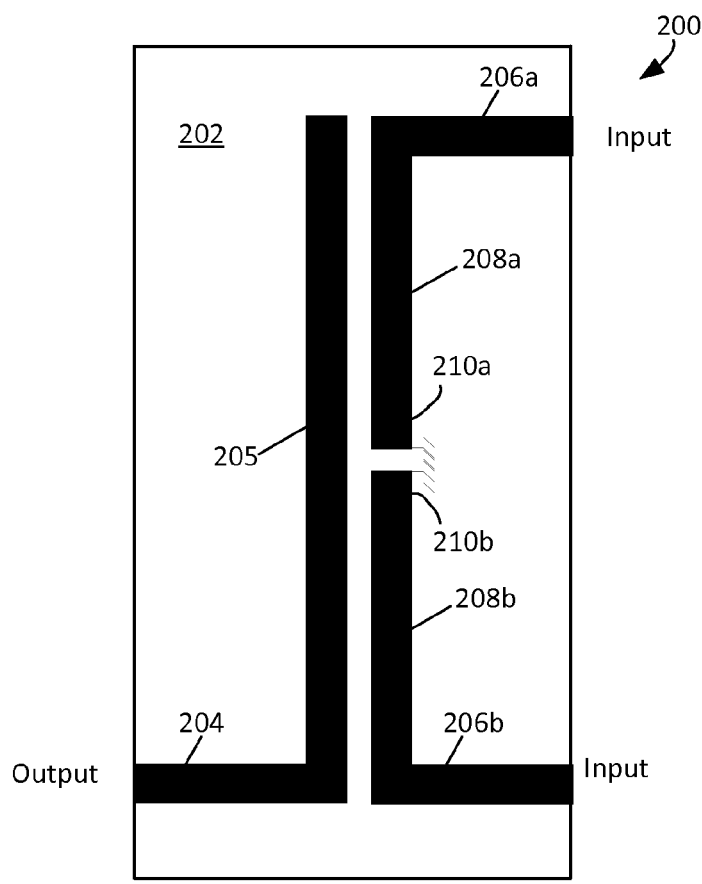
FIG. 2 is a schematic representation of a conventional microstrip balun.

Shown in FIG. 2 is a conventional balun 200 formed in microstrip line on a dielectric substrate 202. The balun 200 has an input port associated with conductive lines 206a, 206b as shown. In some scenarios, the two conductive lines may be connected to an output of a balanced antenna (not shown). The two conductive lines 206a, 206b together define a balanced signal transmission structure. The two conductive lines are arranged to form two coupling elements 208a, 208b, each having an electrical length of approximately λ/4 where λ is the wavelength of the operating frequency. The coupling elements are aligned along a common center line and include adjoining ends 210a, 210b which are spaced apart by a small gap. Each of the adjoining ends 210a, 210b is connected to ground as shown.

A third coupling element in the form of coupled line 205 extends parallel to the coupling elements 208a, 208b. The coupled line 205 is spaced apart from the coupling elements 208a, 208b by a distance, and is connected to an unbalanced output transmission line 204. The coupled line 205 is conventionally chosen to be an open circuited transmission line of total electrical length λ/2. Accordingly, signals at the two opposing ends of the coupled line 205 are precisely 180 degrees out of phase. These two out of phase signals are driven by the λ/4 coupling elements 208a, 208b in which the signals are also out of phase with respect to each other. When used in a conventional receiver system such as is shown in FIG. 1, the balun 200 is usually connected to a filter element (e.g., filter element 106). The interconnects to the filter element 106 will add further losses to the system, such that a receiver system 100 will have an increased noise figure, which is not desirable.

Referring now to FIGS. 3A and 3B, there is shown a selectively tunable electronic circuit 300 which combines the functions of a balun and a bandpass filter. The tunable electronic circuit in FIGS. 3A and 3B is one in which a type of distributed filter is effectively integrated and combined within the functional elements of a balun. According to one aspect, the distributed filter can be similar to a combline type of distributed filter. The resonator elements of the filter are integrated between the balanced and unbalanced coupling lines which are provided for implementing the balun function. A significant advantage of the arrangement shown in FIG. 3 is that three or more filter poles (corresponding to three or more resonator elements) can be incorporated into the design. This allows the circuit to facilitate bandwidths that are narrower than conventional balun designs with tunable bandpass filtering. For example, a conventional balun arrangement using a split ring type resonator element for filtering will facilitate only two filter poles, since only two resonator elements are practical.

The tunable electronic circuit 300 can be formed in microstrip line on a dielectric substrate 302. However, the invention is not limited in this regard and a stripline arrangement is also possible. Planar circuits formed of microstrip and stripline are well known in the art and therefore these structures will not be described here in detail. However, it will be understood that in such systems one or more conductive transmission lines or resonator elements are provided on a major surface of a dielectric substrate having a predetermined thickness and permittivity. A side of the substrate opposed from the major surface comprised of a conductive ground plane 305 which may extend across an entire area beneath the tunable circuit.

The tunable electronic circuit 300 includes a balanced signal transmission structure comprised of two conductive strips 340a, 340b. According to one aspect, the two conductive strips can extend parallel to each other as shown, spaced apart by a distance d0, to define a balance signal transmission system. The terminal ends of conductive strips 340a, 340b together define a balanced signal port 341a, 341b of the device through which a balanced signal can be communicated. The two conductive strips 340a, 340b extend to a center line 348, where they transition to form two coupling elements 342a, 342b. The coupling elements are conductive strips which are aligned along a common center line 348. The coupling elements include adjoining ends 344a, 344b which can be spaced apart by a small gap 346 defined by a distance g1 so that they are electrically isolated. Each of the adjoining ends 344a, 344b is connected to a conductive signal ground as shown. For example, the adjoining ends 344a, 344b can each be connected by means of a conductive via (not shown) to ground plane 305. The ground plane is disposed on a major surface of the substrate 302 opposed from the major surface 303 on which the tunable circuit 300 is disposed.

The overall length of the two coupling elements 342a, 342b plus distance g1 defined by the gap is approximately equal to L1. In some scenarios, the distance g1 between the adjoining ends 344a, 344b can actually be zero, in which case the two coupling elements 342a, 342b would essentially be formed as a single continuous conductive strip. In such a scenario, a single continuous conductive strip comprised of coupling elements 342a, 342b would be connected to ground at a midpoint (i.e., where 342a, 342b meet), such that the two coupling elements 342a, 342b are defined on opposing sides of the midpoint.

The tunable circuit also includes a third coupling element in the form of coupler line 306. Coupler line 306 is a conductive line which extends parallel to the centerline 348 and the two coupling elements 342a, 342b. The coupler line 306 is connected to a conductive ground at stub end 308 as shown. For example, the stub end 308 can be electrically connected by means of a conductive via (not shown) to ground plane 305. An opposing end of the coupler line 306 spaced from the stub end 308 is connected to an unbalanced transmission line section 304. The coupler line 306 and the transmission line section 304 comprise an unbalanced signal transmission structure. The transmission line section 304 is connected to an unbalanced port 301 of the tunable circuit through which unbalanced signals are communicated. As is known, the transmission line section 304 can have a characteristic impedance which is determined in accordance with a width of the transmission line. The tunable circuit 300 functions as a balun to convert a balanced signal received at a balanced port (341a, 341b) to an unbalanced signal which is made available at unbalanced port 301. The circuit operates bi-directionally so that an unbalanced signal supplied at the unbalanced port 301 is converted to a balanced signal which is available at the balanced port (341a, 341b).

In an area of the substrate 302 defined between the coupling elements 342a, 342b and the coupler line 306, there are provided a plurality of resonator elements 314, 324, 334. Three resonator elements are shown in FIGS. 3A and 3B to illustrate a filter having three poles; however it should be appreciated that more or fewer resonator elements are possible. Still, it is important to note that the integration of more than two resonator elements in a tunable filter/balun is a substantial improvement over conventional designs (e.g. split ring resonator designs) which practically facilitate only two filter poles due to their inherent limitations in their design topology.

The resonator elements are comprised of conductive metal strips arranged parallel to the two coupling elements 342a, 342b and to the coupler line 306. The resonator elements are comprised of transmission line stubs having an elongated length and are short circuited at one end 316, 326, 336 to the ground plane. For example, a conductive via (not shown) can be provided through the substrate to form a connection with the ground plane 305. An opposing end of each resonator element 312, 322, 332 is respectively connected to a first terminal of a variable reactive element. In the exemplary arrangement shown in FIGS. 3A and 3B, the variable reactive element is a variable loading capacitor 310, 322, 330. A second terminal of each variable loading capacitor is connected to ground as shown. The elongated resonators elements are oriented so that the ends 316, 326, 336 connected to ground are all on one side of the tunable circuit 300, and the variable capacitors are all at the other side of the tunable circuit.

Resonator element 314 is located adjacent to coupler line 306, spaced apart by a distance d1. Resonator element 334 is located adjacent to the two coupling elements 342a, 342b, spaced apart by a distance d4. Resonator element 324 is located between resonator elements 314, 334 and spaced apart from each respectively by a distance d2 and d3. In the arrangement shown in FIGS. 3A and 3B, the resonator elements 314, 324, 334 comprise a part of a distributed filter design that is similar to a combline type of bandpass filter. Each resonator element has a length which is chosen to facilitate a resonance at an intended operating frequency of the electronic circuit 300. For example, each resonator element could have a length that is chosen for facilitating a quarter wave or half wave resonance at a particular center frequency of interest for a bandpass filter. Resonator elements having lengths to facilitate resonances at other fractions or multiples of λ/4 are also possible.

It will be appreciated that the associated variable loading capacitors 310, 322, 330 will reactively load each resonator element. Also, the physical length of each resonator element will be at least partially a function of substrate material selected for the design. Accordingly, the exact physical and electrical length of each resonator element will be dependent on the details of the design. Also, it will be appreciated that the resonator elements are intended to resonate over a range of frequencies in accordance with a setting of variable loading capacitors 310, 322, 330. Accordingly, the length of each resonator element and the variable capacitor values can be chosen to facilitate a resonant response within a range of possible bandpass center frequencies corresponding to a particular design. The variability of the capacitors 310, 320, 330 allows the resonant frequency of each resonator element 314, 324, 334 to be selectively adjusted. Accordingly, a center frequency of a bandpass filter function for the electronic circuit 300 can be dynamically adjusted or varied in accordance with a particular system requirement.

Coupler line 306 and coupling elements 342a, 342b function as external couplings to the resonator elements 314, 324, 334. As such, the coupling line 306 would ideally have a length L1 approximately corresponding to the length of the resonator elements. For example, if the resonator elements 314, 324, 334 are basically half-wave resonators, then the length of the coupling line 306 would be approximately λ/2. Alternatively, if the resonator elements 314, 324, 334 are basically set up as quarter-wave resonators, then the length of the coupling line 306 would be approximately λ/4. Coupling elements 342a, 342b are basically half as long as coupling element 306 to facilitate balun operation. Accordingly, in a scenario where coupling line 306 is set up as a half-wave element, the coupling elements 342a, 342b would be quarter wave (λ/4) elements; but if coupling line 306 is a quarter-wave element then each of the coupling elements 342a, 342b would be λ/8 elements.

The circuit 300 is designed to provide a variable bandpass filter center frequency corresponding to a variable frequency of interest. Accordingly, the length L1 can be chosen to correspond approximately to the center of a range of operating frequencies. It will be appreciated that such length may be sub-optimal at the upper and lower limits of the operating range since it may not correspond exactly to λ/2 or λ/4 at the actual operating frequency of interest. Accordingly, it can be advantageous in some scenarios to include additional reactive tuning elements to form a tuning network (not shown) interposed between unbalanced transmission line section 304 and coupler line 306. Such a tuning network can help to maintain a desirable resonant frequency for the coupler line 306. For example, such resonant frequency could be chosen to correspond to a particular operating frequency of interest, which also corresponds to a center frequency of a bandpass filter response provided by resonator elements 313, 324, 334. A tuning network as described herein can also help control the impedance observed at port 301. Similarly, it can be advantageous to include a tuning network (not shown) interposed respectively between conductive strips 340a, 340b which form the balanced signal structure and coupling elements 342a, 342b. Such tuning networks can help to maintain a desirable resonant frequency for the coupling elements 342a, 342b and control the impedance observed at ports 341a, 341b. The tuning networks described herein can advantageously facilitate efficient operation of the circuit 300 over a broader range of frequencies.

The tunable circuit in FIGS. 3A and 3B is one in which a type of distributed filter is effectively integrated and combined within the functional elements of a planar circuit design for a balun. The distributed filter shown in FIGS. 3A and 3B is similar to a combline design insofar as the resonator element are all grounded on the same end. Accordingly, conventional design theory for combline filters can be employed as a starting point to determine the physical dimensions of the resonator elements and the spacing between them. The final design, including spacing between the resonators, the coupler line 306 and the coupling elements 342a, 342b can be determined using conventional radio frequency (RF) computer modeling software for planar electromagnetic circuits. In such a design, the important considerations include the coupling coefficients between the respective resonator elements, and the coupling coefficients between the source and load impedance and the respective input/output coupling elements. Other design considerations desired input and output impedances, the desired range of bandpass filter center frequencies to be provided and bandwidth to be achieved as a result of the integrated filter function. In the exemplary tunable circuit shown in FIGS. 3A and 3B, only three resonator elements 314, 324, 334 are provided; but it should be appreciated that different systems may require a different number of resonator elements. For example, increasing the number of resonator elements, while maintaining constant fractional bandwidth, can facilitate a filter with sharper amplitude roll-off, higher selectivity, and less in-band ripple. Accordingly, the inventive arrangements are not limited to tunable electronic circuits having only three resonators as shown.

The tunable circuit shown in FIGS. 3A and 3B facilitates bandpass filtering using an arrangement similar to a combline filter, but it should be noted that the inventive arrangements are not so limited. Other types of distributed filter arrangements can also be used where resonator elements in the form of elongated conductive strips are distributed in the area between the input and output coupling members (i.e., between coupler line 306 and coupling elements 342a, 342b). For example, instead of having each resonator element grounded on the same end of the elongated strip as shown, adjacent resonators can instead be grounded on opposing ends. Such an arrangement would facilitate a distributed filtering approach similar to an interdigital type distributed filter. Variable capacitor elements would then be provided on the opposing ungrounded ends of the conductive resonator strips. Conventional design theory for interdigital filters could be employed as a starting point to determine the physical dimensions of the resonator elements and the spacing between them. The final design, including spacing between the resonators, the coupler line 306 and the coupling elements 342a, 342b would be determined using conventional radio frequency (RF) computer modeling software for planar electromagnetic circuits.

Figure 4:
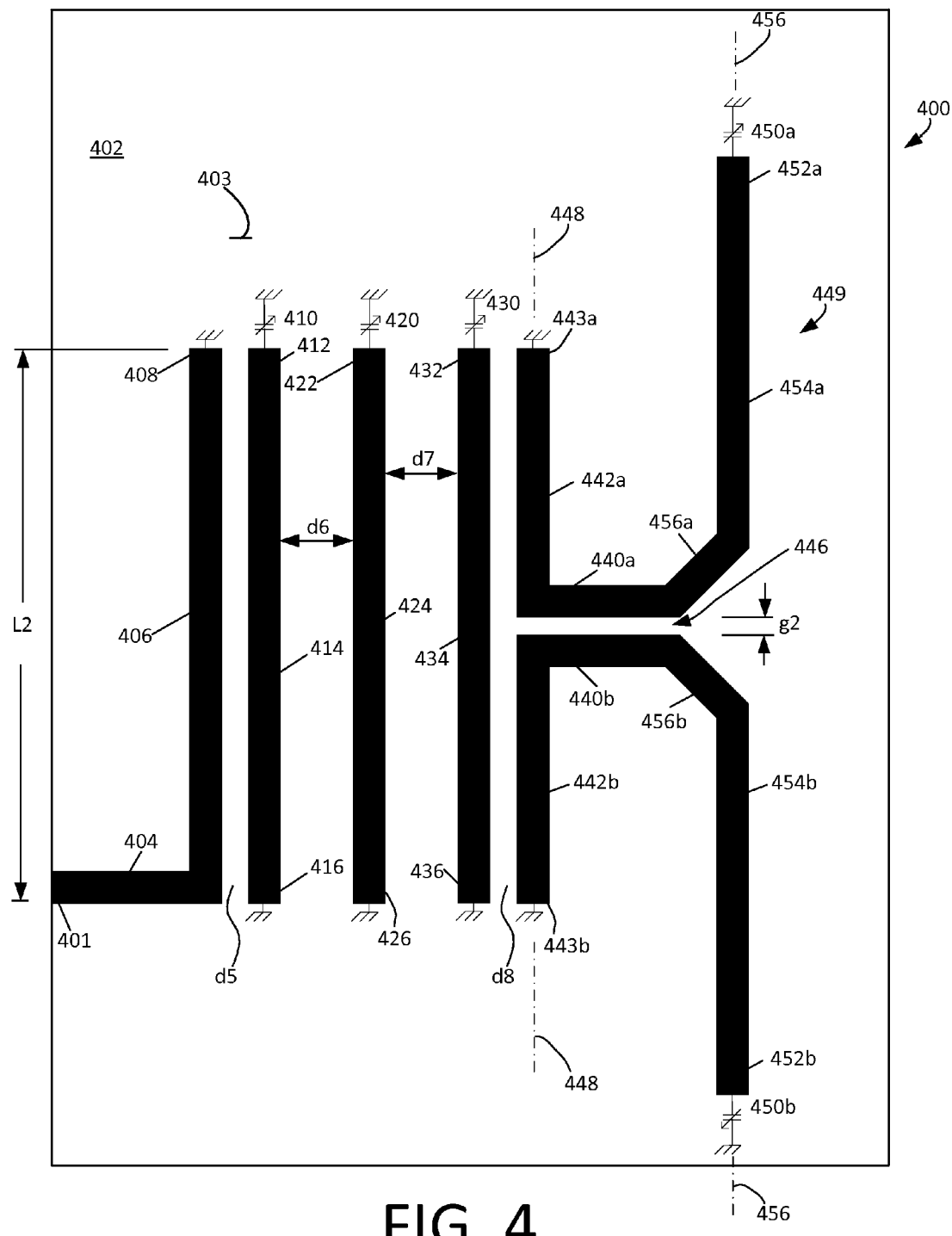
FIG. 4 is a schematic representation showing a top view of a tunable circuit which combines the functions of a balun, a filter and a dipole antenna.

A tunable circuit similar to that described in relation to FIGS. 3A and 3B can be combined with a tunable antenna. The resulting arrangement shown in FIG. 4 is a highly integrated system in which the functions of a balun, a band-pass filter and an antenna can be combined in a single tuned circuit. The tunable circuit 400 can be formed in microstrip or stripline on a dielectric substrate 402. A cross-sectional view of the tunable circuit 400 is omitted, but the arrangement of the ground plane would be similar to that shown in FIG. 3B.

The tunable circuit 400 includes two parallel conductive strips 440a, 440b which are spaced apart by a gap 446 defined by a distance g2. The two spaced apart parallel conductive strips together define a balanced transmission line. The balanced transmission line provides a balanced signal path through which a balanced signal can be communicated. The two conductive strips 440a, 440b extend to a center line 448 where they transition to form two coupling elements 442a, 442b. The coupling elements extend from the gap in opposing directions. Accordingly, the coupling elements 442a, 442b can be disposed on the substrate so that they are substantially perpendicular to the conductive strips 440a, 440b. The coupling elements are aligned along the common center line 448 and define opposing ends 443a, 443b. Each of the opposing ends 443a, 443b is short circuited to a conductive ground as shown. For example, the opposing ends 443a, 443b can be connected by means of a conductive via to a ground plane (not shown). The ground plane is disposed on a major surface of the substrate 402 opposed from the major surface 403 on which the tunable circuit 400 is disposed. The overall length of the two coupling elements 442a, 442b plus distance g2 defined by the gap is approximately equal to L2.

The tunable circuit also includes a third coupling element in the form of coupler line 406. Coupler line 406 extends parallel to the centerline 448 and the two coupling elements 442a, 442b. The coupler line 406 is connected to a conductive ground at stub end 408 as shown. For example, the stub end 408 can be electrically connected by means of a conductive via to a ground plane (not shown) disposed on a major surface of the substrate opposed from surface 402. An opposing end of the coupler line 406 spaced from the stub end 408 is connected to an unbalanced transmission line section 404. The unbalanced transmission line section 404 defines an unbalanced port 401 of the tunable circuit through which unbalanced signals are communicated. The above-described portion of the tunable circuit 400 functions as a balun to convert a balanced signal received at a balanced port (440a, 440b) to an unbalanced signal which is made available at unbalanced port 401. The circuit operates bi-directionally so that an unbalanced signal supplied at the unbalanced port 401 is converted to a balanced signal which is available at the balanced port (440a, 440b).

In an area of the substrate 402 defined between the coupling elements 442a, 442b and the coupler line 406, there are provided a plurality of resonator elements 414, 424, 434. The resonator elements are linear elements arranged parallel to the two coupling elements 442a, 442b and to the coupler line 406. The resonator elements are comprised of transmission line stubs having an elongated length and are short circuited at one end 416, 426, 436 to the ground plane. For example, a conductive via can be provided through the substrate to form a connection with the ground plane. An opposing end of each resonator element 412, 422, 432 is respectively connected to a first terminal of a variable loading capacitor 410, 422, 430. A second terminal of each variable loading capacitor is connected to ground as shown. The elongated resonator elements are oriented so that the ends 416, 426, 436 connected to ground are all on one side of the tunable circuit 400, and the variable capacitors are all at the other side of the tunable circuit.

Resonator element 414 is located adjacent to coupler line 406, spaced apart by a distance d5. Resonator element 434 is located adjacent to the two coupling elements 442a, 442b, spaced apart by a distance d8. Resonator element 424 is located between resonator elements 414, 434 and spaced apart from each respectively by a distance d6 and d7. In the arrangement shown in FIG. 4, the resonator elements 414, 424, 434 comprise a combline type of bandpass filter as described above in relation to FIGS. 3A and 3B. The capacitive end loading of each resonator in the arrangement shown in FIG. 4 allows for a useful reduction in the overall length L2 of each resonator element. The variability of the capacitors 410, 420, 430 allows the center frequency of the bandpass filter to be dynamically adjusted or varied in accordance with a particular system requirement. Coupler line 406 and coupling elements 442a, 442b function as external couplings to the resonator elements 414, 424, 434.

The tunable circuit 400 also includes an antenna 439. The antenna is a design that utilizes a balanced signal feed. In the example shown, the antenna is formed of two antenna elements 454a, 454b which are formed of a conductive material and together comprise a planar dipole antenna 449. Still, the invention is not limited in this regard and other types of antennas utilizing a balanced feed are also possible. The dipole antenna 449 is disposed directly on the same substrate in a manner similar to the resonator and coupling elements described herein. The antenna elements are 454a, 454b are respectively directly connected to the balanced signal path defined by conductive strips 440a, 440b. A portion of the antenna elements 454a, 454b can include a chamfered or matching section 456a, 456b where the antenna elements each define a chamfered angle with respect to the conductive strips 440a, 440b to facilitate impedance matching.

An opposing end 452a, 452b of each antenna element is respectively connected to a first terminal of a variable loading capacitor 450a, 450b. A second terminal of each variable loading capacitor is connected to ground as shown. The elongated antenna elements 454a, 454b are oriented so that the ends 452a, 452b connected to variable capacitors 450a, 450b are located on opposing sides of the tunable circuit. The values of the variable loading capacitors 450a, 450b is advantageously selected so that the dipole antenna can be made resonant within a particular range of frequencies associated with a particular system design. For example, if the tunable circuit 400 is utilized with a wideband radio receiver, it may be desirable to ensure that the antenna can be made resonant at any frequency the wideband radio receiver is designed to cover. It can also be desirable to select the lengths of the antenna elements 454a, 454b and the values of the variable capacitors 450a, 450b so that the dipole antenna can achieve an input impedance that substantially matches the characteristic impedance of transmission lines 440a, 440b.

The tunable circuit shown in FIG. 4 is a highly integrated system in which the functions of a balun, a band-pass filter and an antenna are combined in a single tuned circuit. Variable capacitors 410, 420, 430 can be selectively adjusted to define a center frequency of a bandpass filter suitable for a particular receiver and/or transmit frequency. Concurrently, the variable capacitors 450a, 450b can be adjusted to control a resonant frequency of the antenna portion of the device, and to control the input impedance of the antenna.

The arrangement shown in FIG. 4 is similar to the arrangement in FIGS. 3A and 3B insofar as the resonator elements 414, 424, 434 comprise a part of a distributed filter design that is similar to a combline type of bandpass filter. The variability of the capacitors 410, 420, 430 allows the center frequency of the bandpass filter to be dynamically adjusted or varied in accordance with a particular system requirement. Coupler line 406 and coupling elements 442a, 442b function as external couplings to the resonator elements 414, 424, 434.

The tunable circuit in FIG. 4 is one in which a type of distributed filter is effectively integrated and combined within the functional elements of a planar circuit design for a balun and an antenna. Accordingly, the selection of the physical dimensions of coupler line 406, coupling elements 442a, 442b, resonator elements 414, 424, 434, spacing between the various elements, and the selection of variable capacitor values is similar to that described above with respect to FIGS. 3A and 3B. In the exemplary tunable circuit shown in FIG. 4, only three resonator elements 414, 424, 434 are provided but it should be appreciated that different systems may require a different number of resonator elements. For example, increasing the number of resonator elements, while maintaining constant fractional bandwidth, can facilitate a filter with sharper amplitude roll-off, higher selectivity, and less in-band ripple.

Figure 5:
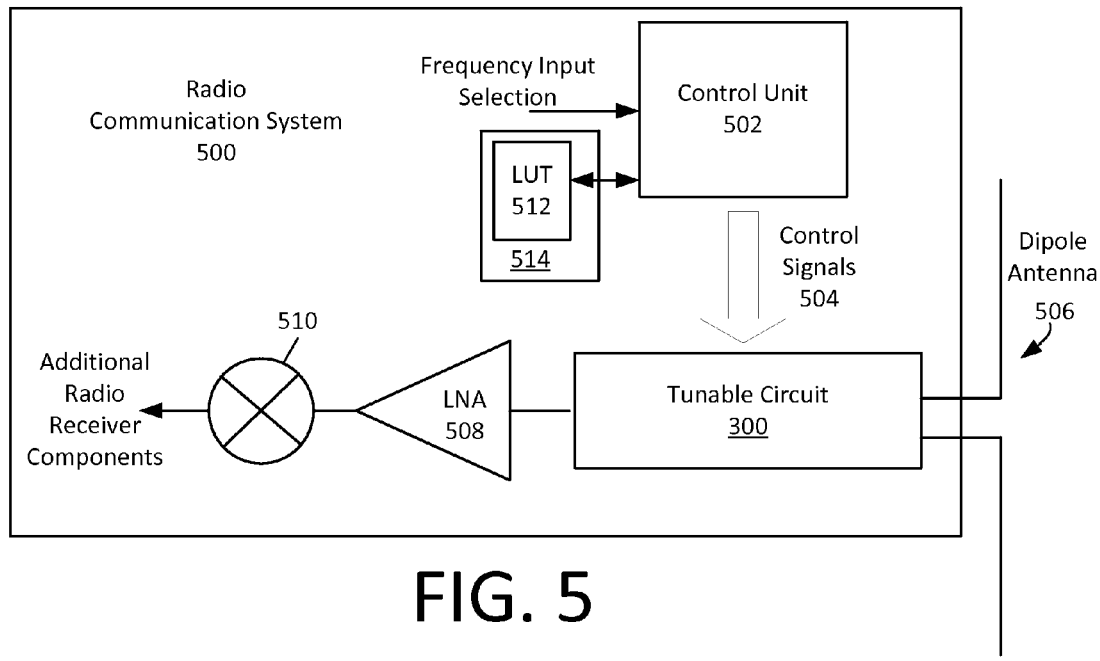
FIG. 5 is a block diagram that is useful for understanding how the tunable circuit in FIGS. 3A and 3B can be integrated in a communication system.

The variable capacitors described can be manually variable, but in some scenarios it is advantageous to instead utilize electronically variable capacitors. Conventional solid-state varactors can be used for this purpose, but in a front end of a radio communication device, it can be advantageous to instead use microwave microelectromechanical systems (MEMS) devices. Moreover, these variable capacitors can be automatically controlled in response to one or more operating conditions. Referring now to FIG. 5, the tunable circuit 300 is shown combined into the front end circuitry of a radio communication system 500. The radio communication system can be a receiver, transmitter, and/or transceiver. In the scenario illustrated in FIG. 5, the communication system includes radio receiving components including an LNA 508 and a mixer 510. The tunable circuit 300 is coupled to a dipole antenna 506 which is separate from and/or located remote from the tunable circuit 300 as shown. The tunable circuit processes signals as described herein, and (in a receive scenario) communicates such signals to the conventional LNA 508. The LNA 508 can be coupled to a conventional mixer 510 and/or other types of radio communication system. A control unit 502 is included as part of the radio communication system and generates control signals 504 which are communicated to the tunable circuit 300 for reasons described below.

An operating condition associated with the communication system 500 is used to selectively control the tunable circuit. For example, the operating condition may be a frequency input selection (e.g. a user frequency input selection), a type of signal being received, and/or detected interference conditions. The control unit 502 responds to the operating condition to generate a plurality of control signals 504 which are used to control the tunable circuit 300. In particular, the control signals are chosen by the control unit to selectively control the variable capacitors 310, 320, 330 within the tunable circuit 300 to optimize communication operations. The control signals can be determined by the control unit 502 in accordance with a Look Up Table (LUT) 512 associated with a data storage device 514. The control signals are chosen in each instance to provide a balun filter response using resonator elements 314, 324, 334 that is optimally suited to current operating conditions. In a scenario where additional tuning networks are provided for the input/output coupling elements (i.e., coupler line 306, coupling elements 342a, 342b) the control signals 604 can also be used to adjust any variable reactive components (e.g. variable capacitors) contained therein.

Figure 6:
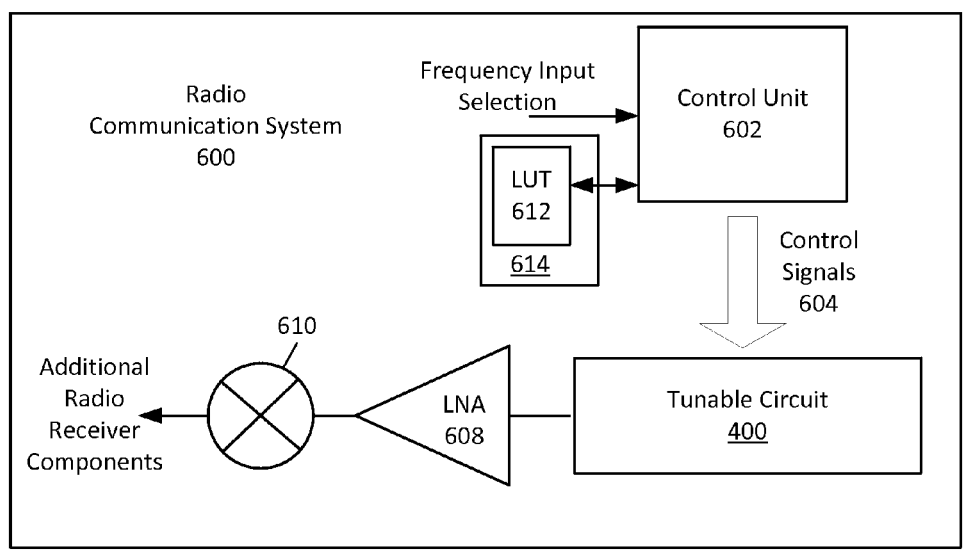
FIG. 6 is a block diagram that is useful for showing how the tunable circuit in FIG. 4 can be integrated in a communication system.

A similar radio communication system 600 is shown in FIG. 6, except that tunable circuit 400 (which includes an integrated antenna) is used in place of tunable circuit 300. Accordingly, no additional external antenna system is required. The communication system 600 includes control unit 602 which generates control signals 604, LNA 608, mixer 610, and LUT 612 contained in a data storage device 614.

An operating condition as described above is used by the control unit 602 as a basis to selectively control the tunable circuit 400. The control unit 602 responds to the operating condition to generate a plurality of control signals 604 which are used to control the tunable circuit 400. The control signals are selected to control the variable capacitors 410, 420, 430, 450a, 450b within the tunable circuit 400 to optimize communication operations. The control signals are chosen in each instance to provide a filter response using resonator elements 414, 424, 434 and an antenna response using antenna 449 that is optimally suited to current operating conditions. In a scenario where additional tuning networks are provided for the input/output coupling elements (i.e., coupler line 406, coupling elements 442a, 442b) the control signals 604 can also be used to adjust any variable reactive components (e.g. variable capacitors) contained therein.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application. Thus, the breadth and scope of the present invention should not be limited by any of the above described embodiments. Rather, the scope of the invention should be defined in accordance with the following claims and their equivalents.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

We claim:

1. A tunable electronic circuit, comprising:
a substrate formed of a dielectric material;
a balanced signal transmission structure includes first and second coupling elements which are disposed on a first major surface of the substrate, each symmetrically connected at one end to a signal ground defined by a ground plane disposed on an opposing second major surface of the substrate;
an unbalanced signal transmission structure including a third coupling element disposed on the first major surface of the substrate and having one terminal end connected to the signal ground;
the first and second coupling elements arranged on the substrate relative to the third coupling element to couple two identical but out of phase signals from the balanced signal transmission structure to the unbalanced signal transmission structure and thereby form a corresponding unbalanced signal in the third coupling element;
a plurality of resonator elements distributed within an area of the substrate defined on one side by the first and second coupling elements and on an opposing side by the third coupling element, the plurality of resonator elements disposed on the first major surface of the substrate so as to be spaced apart from each other and from each of the first, second and third coupling elements;
wherein the plurality of resonator elements are cooperatively configured to produce a bandpass filter response when signals are communicated between the balanced signal transmission structure and the unbalanced signal transmission structure.

2. A tunable electronic circuit, comprising:
a substrate formed of a dielectric material;
a balanced signal transmission structure includes first and second coupling elements which are disposed on the substrate, each symmetrically connected at one end to a signal ground defined by a ground plane disposed on an opposing surface of the substrate;
an unbalanced signal transmission structure including a third coupling element disposed on the substrate and having one terminal end connected to the signal ground;
the first and second coupling elements arranged on the substrate relative to the third coupling element to couple two identical but out of phase signals from the balanced signal transmission structure to the unbalanced signal transmission structure and thereby form a corresponding unbalanced signal in the third coupling element; and
a plurality of resonator elements distributed within an area of the substrate defined on one side by the first and second coupling elements and on an opposing side by the third coupling element, the plurality of resonator elements spaced apart from each other and from each of the first, second and third coupling elements;
wherein the plurality of resonator elements are cooperatively configured to produce a bandpass filter response when signals are communicated between the balanced signal transmission structure and the unbalanced signal transmission structure;
wherein each of the first, second and third coupling elements and each of the plurality of resonator elements is respectively comprised of an elongated conductive planar strip disposed on a first major surface of the substrate, and the ground plane is disposed on an opposing major surface of the substrate.

3. The tunable electronic circuit according to claim 2, wherein the first and second coupling elements are linear elements that extend along a common centerline to adjoining ends.

4. The tunable electronic circuit according to claim 3, wherein the third coupling element is a linear element that extends parallel to the common centerline spaced apart from the first and second coupling elements.

5. The tunable electronic circuit according to claim 4, wherein the plurality of resonator elements are linear elements which extend along a direction parallel to the common centerline.

6. The tunable electronic circuit according to claim 5, wherein the plurality of resonator elements each includes a first end connected to the signal ground.

7. The tunable electronic circuit according to claim 6, further comprising a plurality of variable reactive filter tuning elements, each having a first terminal respectively connected to one of the plurality of resonator elements at a second end opposed from the first end, and having a second terminal connected to the signal ground.

8. The tunable electronic circuit according to claim 7, wherein the plurality of reactive tuning elements are each connected to the radiating elements on a same side of the tunable electronic circuit.

9. The tunable electronic circuit according to claim 7, wherein the plurality of variable reactive filter tuning elements each have a reactive value which facilitates the bandpass filter response at a chosen operating frequency.

10. The tunable electronic circuit according to claim 7, wherein the plurality of variable reactive filter tuning elements are responsive to at least one control signal which determines a reactance setting of the variable reactive filter tuning elements.

11. The tunable electronic circuit according to claim 7, further comprising an antenna disposed on the substrate having a balanced antenna feed which is directly electrically connected to the balanced signal transmission structure.

12. The tunable electronic circuit according to claim 11, wherein the balanced signal transmission structure includes a first and second conductor strips disposed on the substrate and respectively electrically connected to the first and second coupling elements, at least the first conductor connected to a first antenna radiating element disposed on the substrate and at least the second conductor connected to a second antenna radiating element disposed on the substrate.

13. The tunable electronic circuit according to claim 12, further comprising a first variable reactive antenna tuning element having a first terminal connected to the first antenna radiating element and a second variable reactive antenna tuning element having a first terminal connected to the second antenna radiating element, wherein a reactance variation of the first and second variable reactive antenna tuning elements causes a variation in a resonant frequency of the antenna.

14. The tunable electronic circuit according to claim 13, wherein the first variable reactive antenna tuning element has a second terminal connected to the signal ground, and the second variable reactive antenna tuning element has a second terminal connected to the signal ground.

15. The tunable electronic circuit according to claim 13, wherein the first and second variable reactive antenna tuning elements are connected at a terminal end of each of said first and second radiating elements which is distal from a feed end respectively connected to the first and second differential conductor.

16. The tunable electronic circuit according to claim 12, wherein the plurality of variable reactive filter tuning elements, the first variable reactive antenna tuning element, and the second variable reactive antenna tuning element are each responsive to at least one control signal which selectively controls a resonant frequency of the antenna in conjunction with a center frequency of the bandpass filter.

17. The tunable electronic circuit according to claim 16, further comprising a control system responsive to at least one input defining a communication condition, wherein the control signal is produced by the control system.

18. A tunable electronic circuit according to claim 1, wherein the bandpass filter response is defined by at least three poles which correspond to at least three resonances defined by the plurality of resonator elements.

19. A tunable electronic circuit, comprising:
a substrate formed of a dielectric material;
a balanced signal transmission structure includes first and second coupling elements which are disposed on a first major surface of the substrate, each symmetrically connected at one end to a signal ground defined by a ground plane disposed on an opposing second major surface of the substrate;
an unbalanced signal transmission structure including a third coupling element disposed on the first major surface of the substrate and having one terminal end connected to the signal ground;
the first and second coupling elements arranged on the substrate relative to the third coupling element to couple two identical but out of phase signals from the balanced signal transmission structure to the third coupling element and form a corresponding unbalanced signal in the third coupling element;
at least three resonators distributed within an area of the substrate defined on one side by the first and second coupling elements and on an opposing side by the third coupling element, the at least three resonators disposed on the first major surface of the substrate so as to be spaced apart from each other and from each of the first, second and third coupling elements, and cooperatively configured to produce a bandpass filter response having at least three poles.

20. A tunable electronic circuit, comprising:
a substrate formed of a dielectric material;
a balanced signal transmission structure includes first and second coupling elements which are disposed on a first major surface of the substrate, each symmetrically connected at one end to a signal ground defined by a ground plane disposed on an opposing second major surface of the substrate;
an unbalanced signal transmission structure including a third coupling element disposed on the first major surface of the substrate and having one terminal end connected to the signal ground;
at least three resonators distributed within an area of the substrate defined on one side by the first and second coupling elements and on an opposing side by the third coupling element, the at least three resonators disposed on the first major surface of the substrate so as to be spaced apart from each other and from each of the first, second and third coupling elements, and cooperatively configured to produce a bandpass filter response having at least three poles.

\* \* \* \* \*